(12) United States Patent
Tomishima (10) Patent No.: US 8,872,247 B2
(45) Date of Patent: Oct. 28, 2014

(54) MEMORY CELLS HAVING A FOLDED DIGIT LINE ARCHITECTURE

(75) Inventor: Shigeki Tomishima, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1242 days.

(21) Appl. No.: 12/612,546

(22) Filed: Nov. 4, 2009

(65) Prior Publication Data

US 2011/0103125 A1    May 5, 2011

(51) Int. Cl.
| | | |
|---|---|---|
| H01L 27/108 | (2006.01) | |
| G11C 8/00 | (2006.01) | |
| H01L 21/8234 | (2006.01) | |
| H01L 27/088 | (2006.01) | |
| H01L 27/02 | (2006.01) | |

(52) U.S. Cl.
CPC ............ H01L 27/0207 (2013.01); G11C 8/005 (2013.01); H01L 21/823431 (2013.01); H01L 27/0886 (2013.01); H01L 27/10876 (2013.01)
USPC ........... 257/300; 257/255; 257/260; 257/261; 257/296; 257/314; 257/390; 257/E27.084; 257/E27.098

(58) Field of Classification Search
None
See application file for complete search history.

(56) References Cited

U.S. PATENT DOCUMENTS

| | | | |
|---|---|---|---|
| 5,838,038 A | 11/1998 | Takashima et al. | |
| 5,864,496 A | 1/1999 | Mueller et al. | |
| 6,630,379 B2 | 10/2003 | Mandelman et al. | |
| 6,975,552 B2 | 12/2005 | Kim | |
| 7,045,834 B2 | 5/2006 | Tran et al. | |
| 7,046,578 B2 | 5/2006 | Tomishima | |
| 7,118,960 B2 | 10/2006 | Tran | |
| 7,177,213 B2 | 2/2007 | Tomishima | |
| 7,349,232 B2 | 3/2008 | Wang et al. | |
| 7,385,871 B2 | 6/2008 | Tomishima | |
| 7,423,923 B2 | 9/2008 | Tomishima | |
| 7,466,615 B2 | 12/2008 | Tomishima | |
| 7,482,229 B2 | 1/2009 | Juengling | |
| 7,512,025 B2 | 3/2009 | Yoon et al. | |
| 2004/0041199 A1* | 3/2004 | Kim | 257/315 |
| 2005/0245024 A1* | 11/2005 | von Schwerin | 438/243 |
| 2006/0046407 A1* | 3/2006 | Juengling | 438/301 |
| 2006/0209604 A1 | 9/2006 | Tomishima | |
| 2007/0177442 A1 | 8/2007 | Tomishima | |
| 2007/0181929 A1 | 8/2007 | Juengling | |
| 2008/0225627 A1 | 9/2008 | Tomishima | |
| 2009/0003038 A1 | 1/2009 | Tomishima | |
| 2009/0073791 A1 | 3/2009 | Tomishima | |
| 2009/0238000 A1* | 9/2009 | Juengling | 365/185.13 |
| 2009/0238010 A1 | 9/2009 | Juengling | |

OTHER PUBLICATIONS

U.S. Appl. No. 12/130,825, filed May 30, 2008, Werner Juengling.

* cited by examiner

*Primary Examiner* — Steven Loke
*Assistant Examiner* — Cuong B Nguyen
(74) *Attorney, Agent, or Firm* — Fletcher Yoder PC (57) ABSTRACT

Memory arrays having folded architectures and methods of making the same. Specifically, memory arrays having a portion of the transistors in a row that are reciprocated and shifted with respect to other transistors in the same row. Trenches formed between the rows may form a weave pattern throughout the array, in a direction of the row. Trenches formed between legs of the transistors may also form a weave pattern throughout the array in a direction of the row.

11 Claims, 9 Drawing Sheets

MEMORY CELLS HAVING A FOLDED DIGIT LINE ARCHITECTURE

BACKGROUND

1. Field of Invention

Embodiments of the invention relate generally to semiconductor devices, and more specifically, in certain embodiments, to memory devices.

2. Description of Related Art

Integrated circuit designers often desire to increase the level of integration or density of elements within an integrated circuit by reducing the size of the individual elements and by reducing the separation distance between neighboring elements. In addition, integrated circuit designers often desire to design architectures that are not only compact, but offer performance advantages, as well as simplified designs. One example of a common integrated circuit element is a transistor, which can be found in many devices, such as memory circuits, processors, and the like. A typical integrated circuit transistor comprises a source, a drain, and a gate formed at the surface of the substrate.

A relatively common integrated circuit device is a memory device. One type of memory cell is a dynamic random access memory (DRAM). In the simplest design configuration, a DRAM cell includes one access device, such as a transistor, and one memory storage structure, such as a capacitor. Modern applications for semiconductor devices can utilize vast numbers of DRAM unit cells, arranged in an array of rows and columns. The DRAM cells are electrically accessible through digit lines and word lines arranged throughout along the rows and columns of the array.

It may be desirable to design DRAM cells that have small feature sizes, as well as optimized performance. As feature sizes and dimensions between memory elements, and the word lines and digit lines that connect those memory elements is reduced, pattern noise may increase and other electrical performance may decrease. It would therefore be desirable to develop new semiconductor device constructions that can be utilized in semiconductor applications, such as DRAM structures.

DETAILED DESCRIPTION

Figure 1:
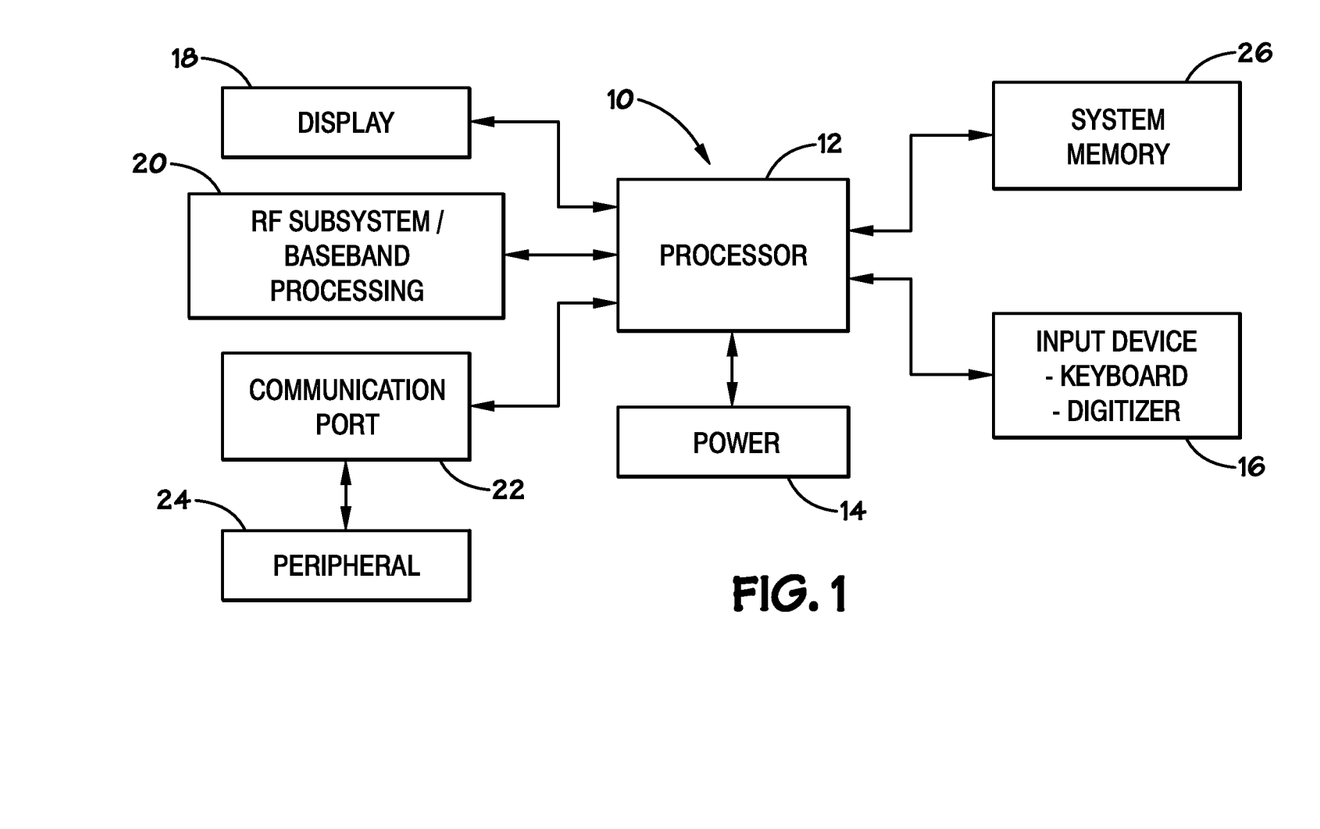
FIG. 1 illustrates a block diagram of a system having memory which may be fabricated in accordance with embodiments of the invention.

Turning now to the drawings, and referring initially to FIG. 1, a block diagram depicting an embodiment of a processor-based system, generally designated by reference numeral 10, is illustrated. The system 10 may be any of a variety of types such as a computer, pager, cellular phone, personal organizer, portable audio player, control circuit, camera, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, such that the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a stylus, a mouse, and/or a voice recognition system, for instance. A display 18 may also be coupled to the processor 12. The display 18 may include an LCD, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to efficiently carry out its functionality. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As described further below, the system memory 26 may include one or more memory devices, such as DRAM memory devices, fabricated in accordance with embodiments of the present invention.

Figure 2:
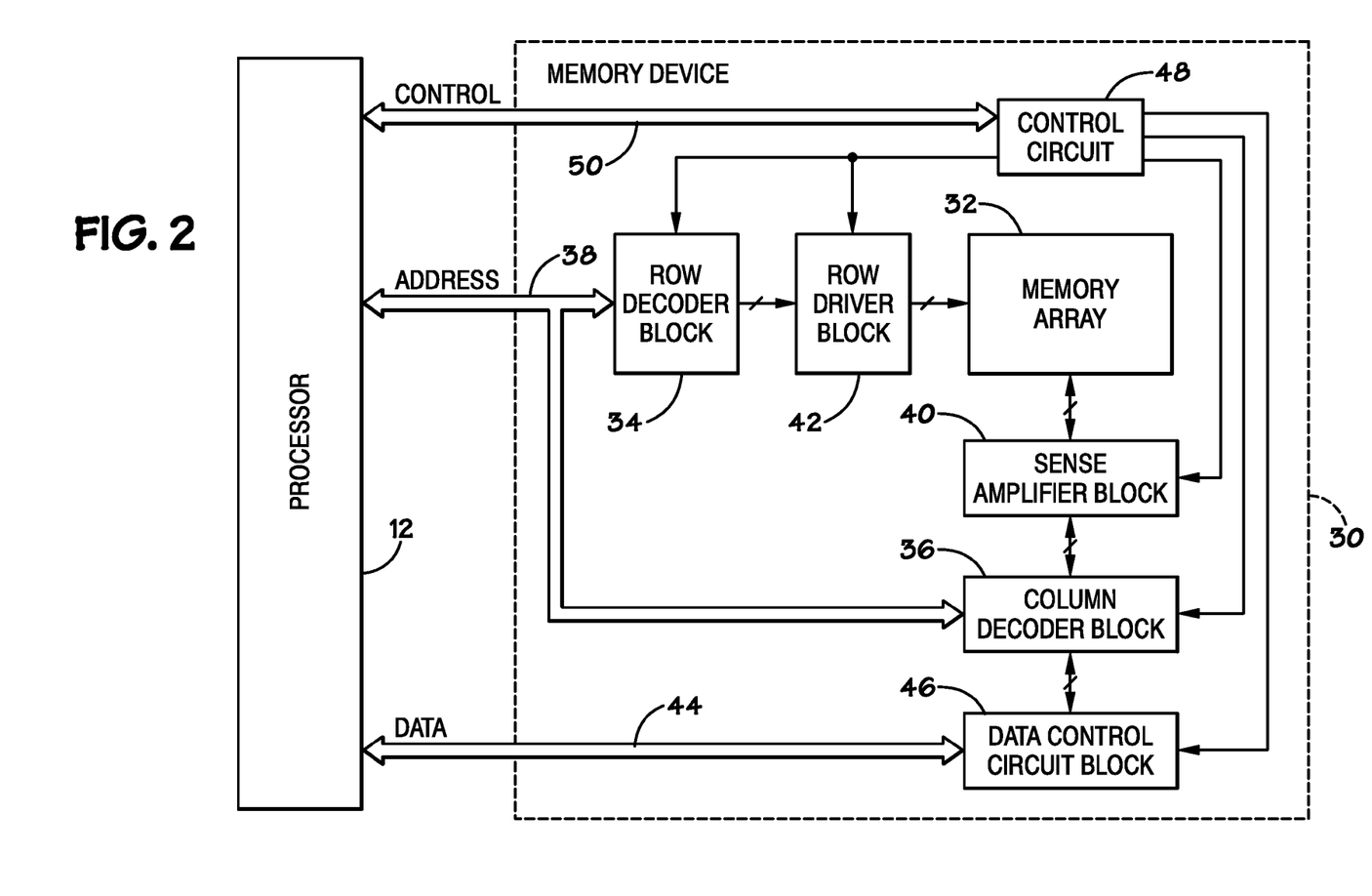
FIG. 2 illustrates a block diagram of a memory device having a memory array which may be fabricated in accordance with embodiments of the invention.

FIG. 2 is a block diagram illustrating a memory device, e.g., a DRAM memory device 30, which may be included in the system memory 26 of FIG. 1. The DRAM memory device 30 generally includes a memory array 32, which may be fabricated in accordance with embodiments of the present invention. As will be described further below, the memory array 32 includes many rows and columns of conductive traces logically arranged in a grid pattern to form a number of access lines and data lines. The access lines used to access the cells in the memory array 32, are typically arranged in rows or "row lines," and are generally referred to as "word lines" (WL). The data lines used to sense (e.g., read) the cells, are typically arranged in columns or "column lines," and are generally referred to as "bit lines" (BL) or "digit lines" (DL). The size of the memory array 32 (i.e., the number of memory cells) will vary depending on the size of the DRAM memory device 30.

To access the memory array 32, a row decoder block 34 and a column decoder block 36 are provided and are configured to receive and translate address information from the processor 12 via the address bus 38 to access a particular memory cell in the memory array 32. A sensing circuit, such as the sense amplifier block 40 having a plurality of the sense amplifiers, is also provided between the column decoder 36 and the memory array 32 to sense individual data values stored in the memory cells of the memory array 32. Further, a row driver block 42 is provided between the row decoder block 34 and the memory array 32 to activate a selected word line in the memory array according to a given row address.

During read and write operations, data may be transferred to and from the memory device 30 via the data bus 44. The coordination of the data and address information may be conducted through a data control circuit block 46. Further, the memory device 30 may include a control circuit 48 configured to receive control signals from the processor 12 via the control bus 50. The control circuit 48 is coupled to each of the row decoder block 34, the column decoder block 36, the sense amplifier block 40, the row driver block 42 and the data control circuit block 46, and is generally configured to coordinate timing and control among the various circuits in the DRAM memory device 30.

Figure 3:
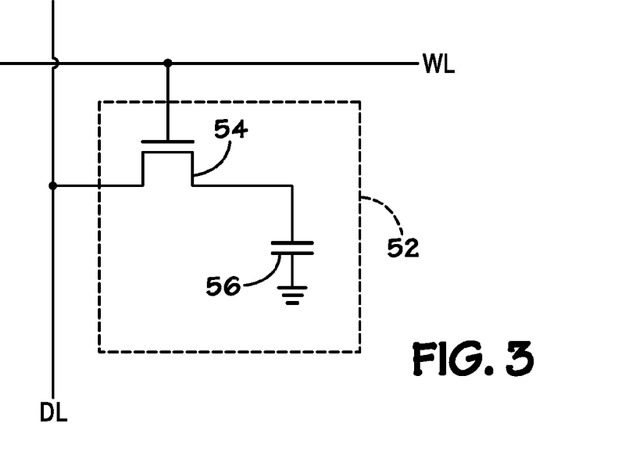
FIG. 3 illustrates a schematic diagram of a memory cell which may be fabricated in accordance with embodiments of the invention.

As previously described, the DRAM memory array 32 includes a number of memory cells. Each of the memory cells is coupled to a respective word line WL and a respective digit line DL. As will be appreciated, each cell of a DRAM memory array typically includes an access device and a storage device. Referring specifically to FIG. 3, a schematic diagram of a DRAM memory cell 52 is illustrated. The illustrated embodiment of the memory cell 52 includes a field effect transistor (FET) 54 which is implemented to provide access (i.e., the access device) to a storage device, here a capacitor 56. The gate of the FET 54 is coupled to a word line WL and the drain of the FET 54 is coupled to a digit line DL. By controlling the gate via a voltage applied to the word line WL, a charge on the data line DL may be stored in the capacitor 56, as previously described. As will be described further below, the memory cells 52, and the entire DRAM memory array 32, may be fabricated in accordance with embodiments of the present invention.

As will be appreciated, the DRAM memory cell 52 may employ other access devices, in place of the FET 54, and/or other storage devices, in place of the capacitor 56. For example, in certain embodiments, it may be possible to replace the FET 54 with other types of access devices, such as a Bipolar Junction Transistor (BJT) or an insulated gate bipolar transistor (IGBT). Further, the capacitor 56 may be replaced with a floating gate of a floating-gate transistor or a charge repository of a silicon-oxide-nitride (SONOS) device, or it may include a phase-change memory material, e.g., an ovonic material. In some embodiments, the capacitor 56 may be replaced with an SRAM memory element with a flip-flop, or it may include a programmable-metallization cell, a ferromagnetic-memory device, or a magnetoresistive-memory device. In other embodiments, the capacitor may be replaced with an imaging device, such as a charge-coupled device or a photo diode, or another type of sensor, such as a chemical sensor.

Figure 4:
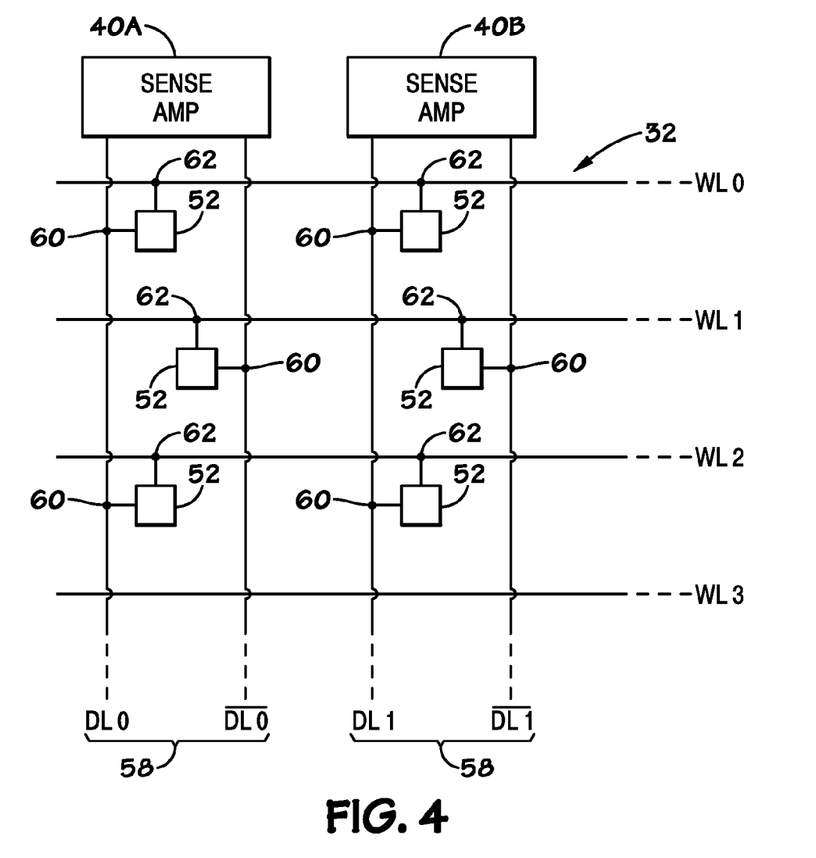
FIG. 4 illustrates a partial block diagram of a memory array having a folded digit line architecture which may be fabricated in accordance with embodiments of the invention.

Referring now to FIG. 4, a portion of the memory array 32, which may be fabricated in accordance with embodiments of the invention, is illustrated. As previously described, the memory array 32 includes a number of memory cells 52 arranged in a grid pattern and connected by a series of word lines (WL) and digit lines (DL). The digit lines DL are implemented to read and write data to the memory array 32, and the word lines WL are implemented to access a particular row of the memory array 32. In one type of architecture, sensing circuits, such as the sense amplifiers 40A and 40B are coupled to complimentary digit lines and are configured to sense a differential voltage between digit line pairs (DL and $\overline{DL}$).

More specifically, FIG. 4 illustrates an embodiment of a memory array 32 having a folded digit line architecture. In a folded digit line architecture, each pair of complimentary digit lines (DL and $\overline{DL}$) in a column 58 is coupled to alternate memory cells in the same memory array or sub-array. Each pair of complimentary digit lines (DL0 and $\overline{DL0}$ or DL1 and $\overline{DL1}$) is coupled to the inputs of a respective sense amplifier (e.g., 40A or 40B). Thus, as will be illustrated and described further below, in accordance with the present embodiments employing a folded digit line architecture, each memory cell 52 having a digit line contact 60 along a respective digit line (e.g., DL0), includes a word line contact 62 coupling successive (i.e., immediately adjacent) memory cells in the column to every other word line (e.g., WL0, WL2, etc.), rather than every word line, as would be the case in an open architecture. In other words, each word line WL connects (i.e., forms a cross-point or cross-hair) with an access device (e.g., a FET 54) on every other digit line DL of the memory array 32.

As will be appreciated, the folded digit line architecture illustrated in FIG. 4 provides certain advantages over open architectures, wherein complimentary digit lines connected to a sense amp are received from separate arrays, and wherein every memory cell in a particular column is coupled to every successive word line. In the folded digit line architecture, the noise sources affecting each sense amplifier (e.g., 40A and 40B) through the memory array 32 will have many common nodes which may essentially cancel each other out. Thus, the folded digit line architecture generally provides digit lines that are likely to remain substantially unaffected by internal noise from adjacent digit lines and the cell plate, the data pattern sensitivity, the sense amplifier layout imbalance, etc. Consequently, sensing the difference between the complimentary digit lines (DL0 and $\overline{DL0}$ or DL1 and $\overline{DL1}$) is less difficult. In general, the folded digit line architecture may provide better signal-to-noise performance.

As previously discussed, one type of access device that may be employed, in accordance with embodiments of the invention is a FET. More specifically, in accordance with one embodiment, each access device may be a "finFET." FinFETs generally provide a convenient and compact way to provide a transistor having a vertical fin structure wherein the transistor channel may be formed. Thus, as opposed to planar transistors having channels formed in a purely horizontal direction, finFETs provide for fabrication in the vertical direction, relative to the plane of the substrate. In certain finFET designs, the fin may be fabricated in such a way as to provide for the gate of the transistor to be wrapped around or formed on more than one surface of the fin, thereby providing better control of the channel of the device. Further, the three-dimensional nature of the finFET allows for a variety of designs that may be utilized to reduce the size of the array.

Figure 5:
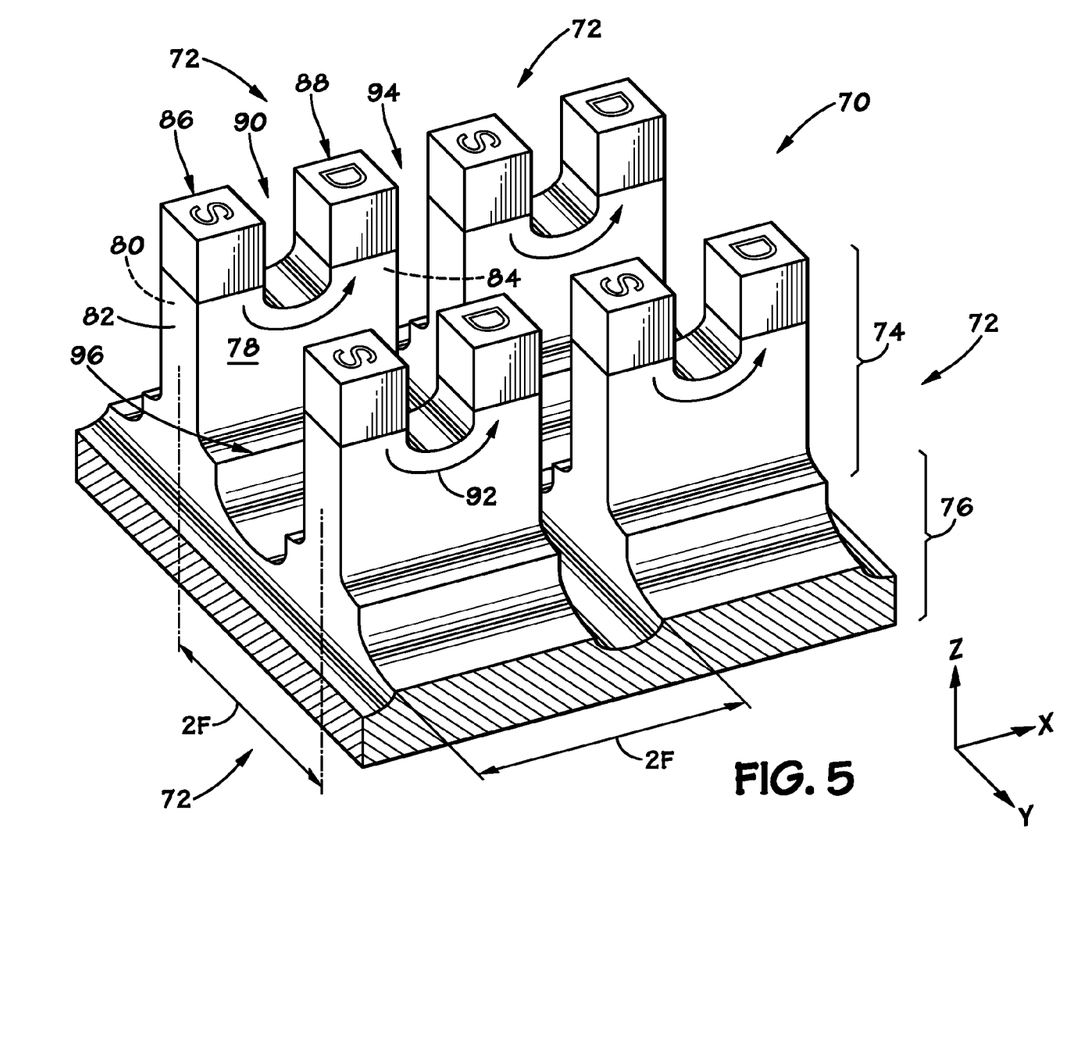
FIG. 5 illustrates a partial perspective view of a portion of a memory array having a 4F2 architecture.

Turning now to FIG. 5, a partial perspective view of a portion of a memory array 70 having a plurality of finFETs 72 is illustrated. In particular, FIG. 5 illustrates a semiconductor portion of four finFETs 72. As illustrated in FIG. 5, the semiconductor portion of each finFET 72 may include a fin 74 extending from a base 76. The fin 74 and the base 76 may be made from a variety of semiconductor materials, such as single-crystal silicon. The illustrated fin 74 includes two sides 78 and 80 and two edges 82 and 84. In general, the edges 82 and 84 are narrower than the sides 78 and 80. Each illustrated fin 74 includes two legs 86 and 88 separated by a shallow trench 90. The upper portion of the legs 86 and 88 may be doped differently than the lower portion of the legs 86 and 88, the lower portion of the fin 74 and the base 76, and thus provides the material from which a source (S) and a drain (D) of the finFET 72 are formed. For example, in some embodiments, the upper-doped portion of the legs 86 and 88 may be doped with an n+ material, and the lower-doped portion of the legs 86 and 88, the lower portion of the fin 74 and the base 76 may be doped with a p− material. As will be appreciated, the upper-doped portion of the legs 86 and 88 does not extend below the shallow trench 90. The shallow trench 90 provides isolation between the source (S) and drain (D) of each finFET 72.

In the illustrated embodiment, the shallow trench 90 may be generally U-shaped. In alternate embodiments, the shallow trench 90 may have a more rectangular shape, or a tapered shape. Each shallow trench 90 may run through the entire memory array 70 and is filled with a dielectric (not shown) to provide electrical isolation between the source (S) and drain (D). As will be illustrated with regard to FIG. 6, though the shallow trench 90 may run through the entire array, portions of the trench may be partially filled or blocked by the word lines running along the sides 78 and 80. Once the array 70 is fully fabricated, the channel 92 may be formed through the lower-doped portion, between the two legs 86 and 88. As explained below with reference to FIG. 6, the gates (which form the word lines) may be disposed against the sides 78 and 80 of the fin 74, and electric fields emanating from these gates may establish the channel 92 through which current flows from the source to the drain, during operation.

Figure 6:
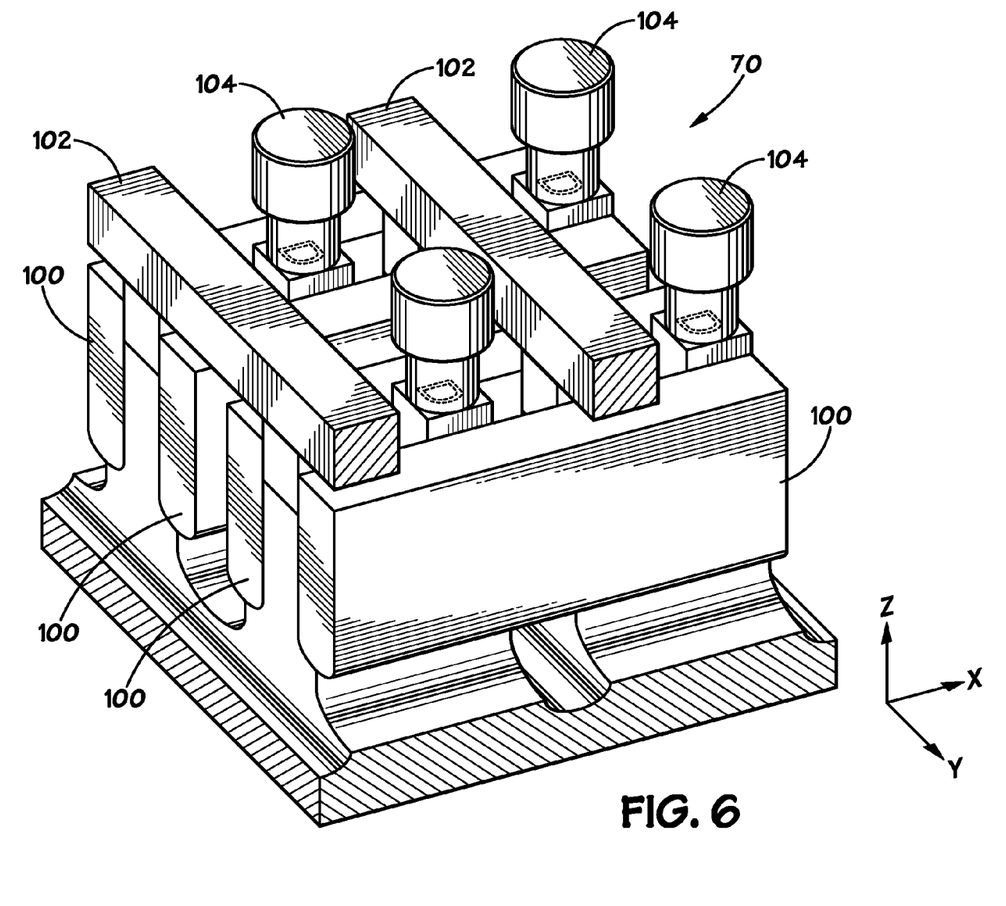
FIG. 6 illustrates a partial perspective view of the portion of the memory array of FIG. 5, illustrating additional features.

As will be illustrated further with regard to FIG. 6, each finFET 72 in a row in the X-direction (i.e., along the word line), is separated by a deep row isolation trench 94 to isolate each of the finFETs 72 in a row. Each deep row isolation trench 94 may include a dielectric material, such as an isolation oxide, disposed therein once the array is completely fabricated (not illustrated). Further, each column of the array 70 in the Y-direction (i.e., along the digit line) is separated by deep column isolation trenches 96 to isolate each column of the array 70. The deep column isolation trench 96 may also include a dielectric material, such as an isolation oxide, disposed therein (not illustrated). As will be evident, other structures, such as the word lines, may be formed through a portion of the deep column isolation trenches 96, as well.

The partial portion of the array 70 includes memory cells having a cell size of approximately $4F^2$, where F is the minimum realizable process dimension. The pitch may be defined as the distance between one structure of a cell and the same structure in the next cell. As illustrated, each structure of a finFET 72 is separated from a like structure of the next adjacent finFET 72 in a row (X-direction) by approximately 2F. Similarly, each structure of a finFET 72 is separated from a like structure of the next finFET 72 in a column (Y-direction) by approximately 2F. Thus, it can be said that the row pitch (distance between each row) and column pitch (distance between each column) are each 2F.

As will be illustrated with regard to FIG. 6, the storage device of each memory cell is formed above, and within the geometry of the 2F×2F size. Accordingly, each memory cell is said to have a cell size of approximately $4F^2$. In FIG. 5, each leg 86 and 88 of each finFET 72 has a ½F×½F area in the X-Y plane. Each shallow trench 90 is ½F wide, from source (S) to drain (D). Thus, the width of each fin 74 along an edge 82 or 84 is ½F. Further, the deep row isolation trench 94 has a width of ½F. Finally, as will be illustrated and described with reference to FIG. 6, because the word lines are formed along the surfaces 78 and 80, the width of the deep column isolation trench is approximately 1½F at it widest point, such that a word line, having a ½F width can be formed on each surface 78 and 80, and a ½F distance can be formed between each word line.

Turning now to FIG. 6, additional features of the portion of the memory array 70 are illustrated. For clarity, certain reference numbers previously enumerated in FIG. 5, and certain features, such as row and column isolation oxides, as well as gate oxides, have been omitted for purposes of illustration. Those skilled in the art will appreciate the additional features and materials that may be included in the array 70. As previously discussed, the finFETs 72 are generally arranged in columns of word lines 100, along the X-axis. The word lines 100 form the gates of the finFETs 72 and are disposed on either side of each finFET 72, as illustrated. As will be appreciated, each of the gates formed by the word lines 100 may be separated from the semiconductor portion of the finFETs 72 by a gate dielectric (not shown). Each illustrated column of finFETs 72 (along the X-axis) may be isolated from the adjacent column of finFETs 72 by an inter-column dielectric (not shown) disposed in the deep column isolation trenches 96 (FIG. 5), and each finFET 72 within a row (along the Y-axis) may be isolated from adjacent finFETs 72 in the same row by an inter-row dielectric (now shown) disposed in the deep row disposed between rows in the row isolation trenches 94 (FIG. 5).

The open-digit line architecture array 70 may be manufactured with a cross-point process. In one example of this type of process, the array 70 is patterned with a sequence of masks that form generally orthogonal lines. For example, initially, a substrate may be field implanted with dopants to form the upper-doped and the lower-doped portions that will form the legs 86 and 88, and then, the inter-row dielectric and the inter-leg dielectric (the dielectric disposed between the legs 86 and 88 in shallow trench 90 of FIG. 5) may be patterned with one or more masks having a pattern of lines generally extending in the Y-direction. In some embodiments, these features are patterned with sub-lithographic-resolution techniques, such as undercutting a hard mask, reflowing photoresist, or double pitching a mask with sidewall spacers.

Next, the other features of the array 70 may be patterned with one or more additional masks having lines generally extending in the X direction. It is from the generally orthogonal relationship between the lines of the first and second set of masks that the cross-point array process takes its name. In some embodiments, the fins 74 may be etched and, then, the word lines 100 that form the gates of the finFETs 72 may be formed as sidewall spacers along the sides of the fins 74. The inter-column dielectric may then be formed between the sidewall spacers to isolate the word lines 100. In other embodiments, the inter-column dielectric may be formed before the word lines 100. For example, trenches 96 (FIG. 5) extending in the X direction may be etched and filled with material for the inter-column dielectric and then, trenches 96 for the word lines may be etched, thereby generally simultaneously defining both the fins 74 and the shape of the inter-column dielectric. In some embodiments, the fins 74, the word lines 100, and the inter-column dielectric may be patterned with sub-lithographic-resolution techniques as well, and one or more of them may have widths that are less than or generally equal to the lithographic-resolution limit, e.g., less than the photo-lithographic-resolution limit. In some embodiments, the word lines 100 on each side of the fins 74 in a column may be electrically coupled to one another for better control of the gate of the finFET 72. Thus, a pair of illustrated spacers which form the word lines 100 may, for practical purposes, form a single word line.

As further illustrated, digit lines 102 may be formed on the array 70. In this embodiment, the digit lines 102 are formed by depositing a generally conductive material and patterning the generally conductive material to form generally straight and generally parallel lines generally extending in the Y direction. The illustrated digit lines 102 connect to the source of the finFETs 72, which in this embodiment corresponds with the legs 86. In other embodiments, the digit lines 102 may connect to the drains. In the illustrated open architecture of the array 70, the digit lines 102 along a row are coupled to each finFET 72 in all adjacent columns. Thus, each digit line 102 is coupled to each of the memory cells in the row. Further, as illustrated with regard FIGS. 5 and 6, and accordance with the presently illustrated open architecture, each of the trenches 90, 94, and 96, each of the word lines 100 and each of the digit lines 102 are generally parallel or perpendicular (orthogonal) to one another.

In addition, each memory cell includes a storage device, here a capacitor 104, which may be coupled to the terminal of each finFET 72, which is not coupled to the digit line 102, here the drain of each finFET 72. In the present illustration, the capacitors 104 may be stacked capacitors having a generally cylindrical cup-shape, formed on top of a smaller cylindrical contact post. As will be appreciated, other storage devices, including other types of capacitors, may also be employed. In order to remain within the $4F^2$ cell size, each capacitor 104 is sized and arranged such that it remains within the planar horizontal footprint of the cell.

Figure 11:
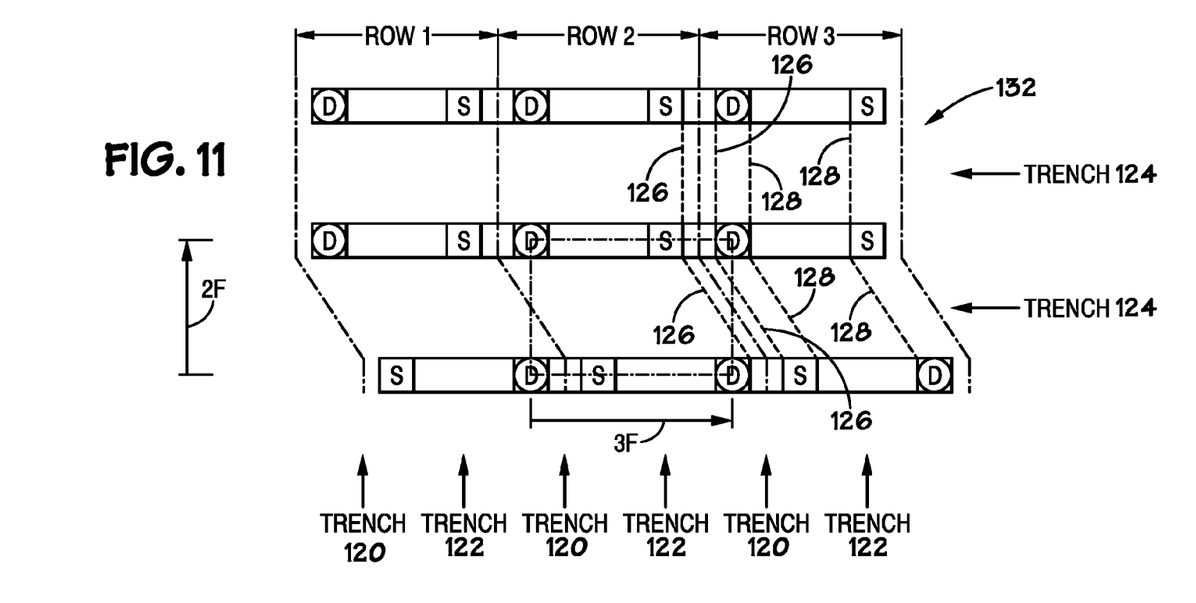
FIG. 11 illustrates a top plan view of an alternate embodiment of the memory array of FIG. 7, in accordance with embodiments of the invention.
Figure 12:
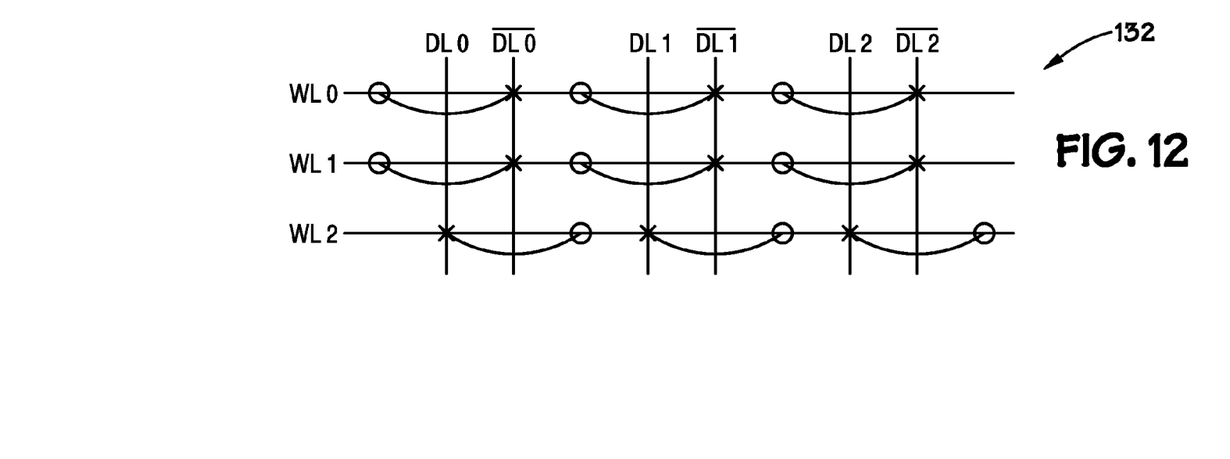
FIG. 12 illustrates a schematic view of the digit line contacts and storage node contacts of the memory array of FIG. 11, in accordance with embodiments of the invention.

While the above-described array 70, having an open architecture may provide certain advantages, a folded array architecture in accordance with embodiments of the present invention may provide additional advantages over previous open architectures, as well as previous folded architectures. As will be appreciated, an open digit line architecture provides for a system where each sense amplifier reads complimentary digit lines, wherein the digit line and its compliment are from different sections or sub-arrays. While the cell size reduction attainable through conventional open digit line architectures ($6F^2$ and $4F^2$) is desirable, the sense amplifier imbalance, which includes the R and C difference for the complimentary digit lines, and the fact that the operation of the array will have cell data dependency, often means that designers chose to sacrifice the size reduction of open architectures for the performance improvement of folded digit line architectures. With conventional folded digit line architectures, typical cell sizes are $8F^2$ and larger. As will be discussed, FIGS. 7-10 illustrate one embodiment of the invention wherein a folded digit line architecture is attainable with a 6F2 cell size. FIGS. 11-12 illustrate another embodiment of the invention.

Figure 7:
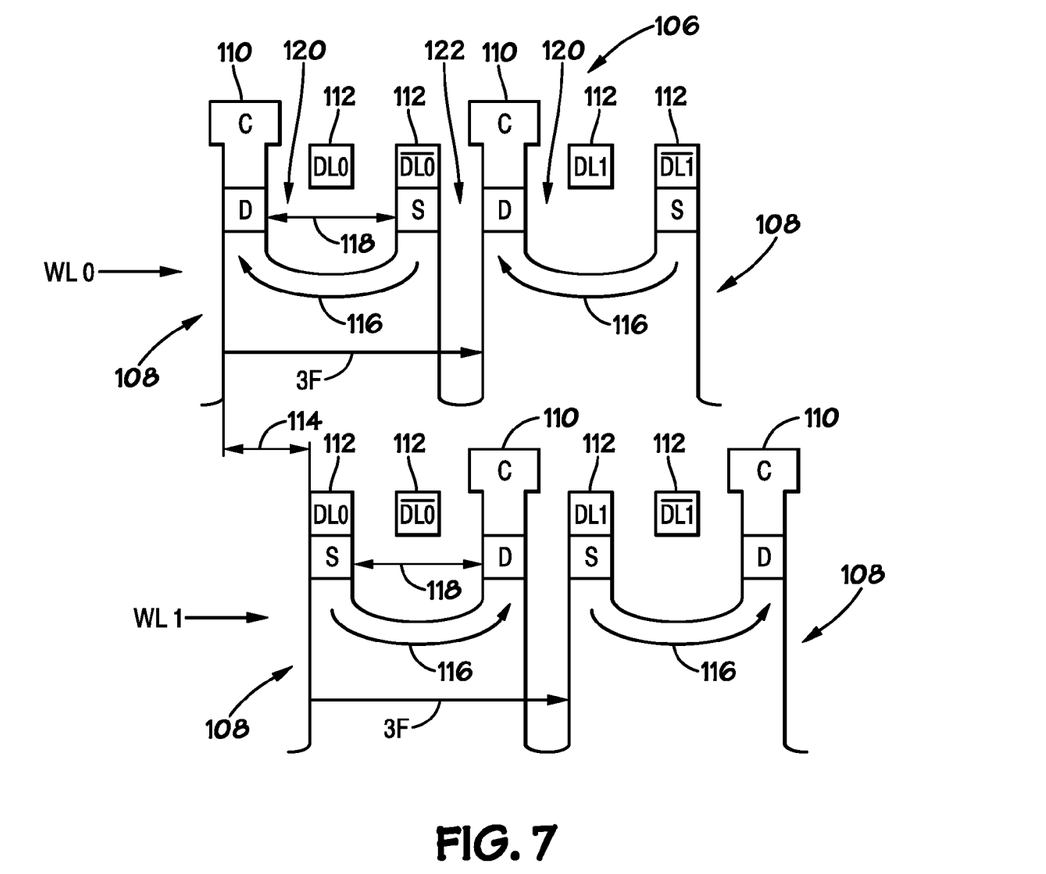
FIG. 7 illustrates a cross-sectional view through word lines of a memory array having a folded digit line 6F2 architecture, in accordance with embodiments of the invention.
Figure 8:
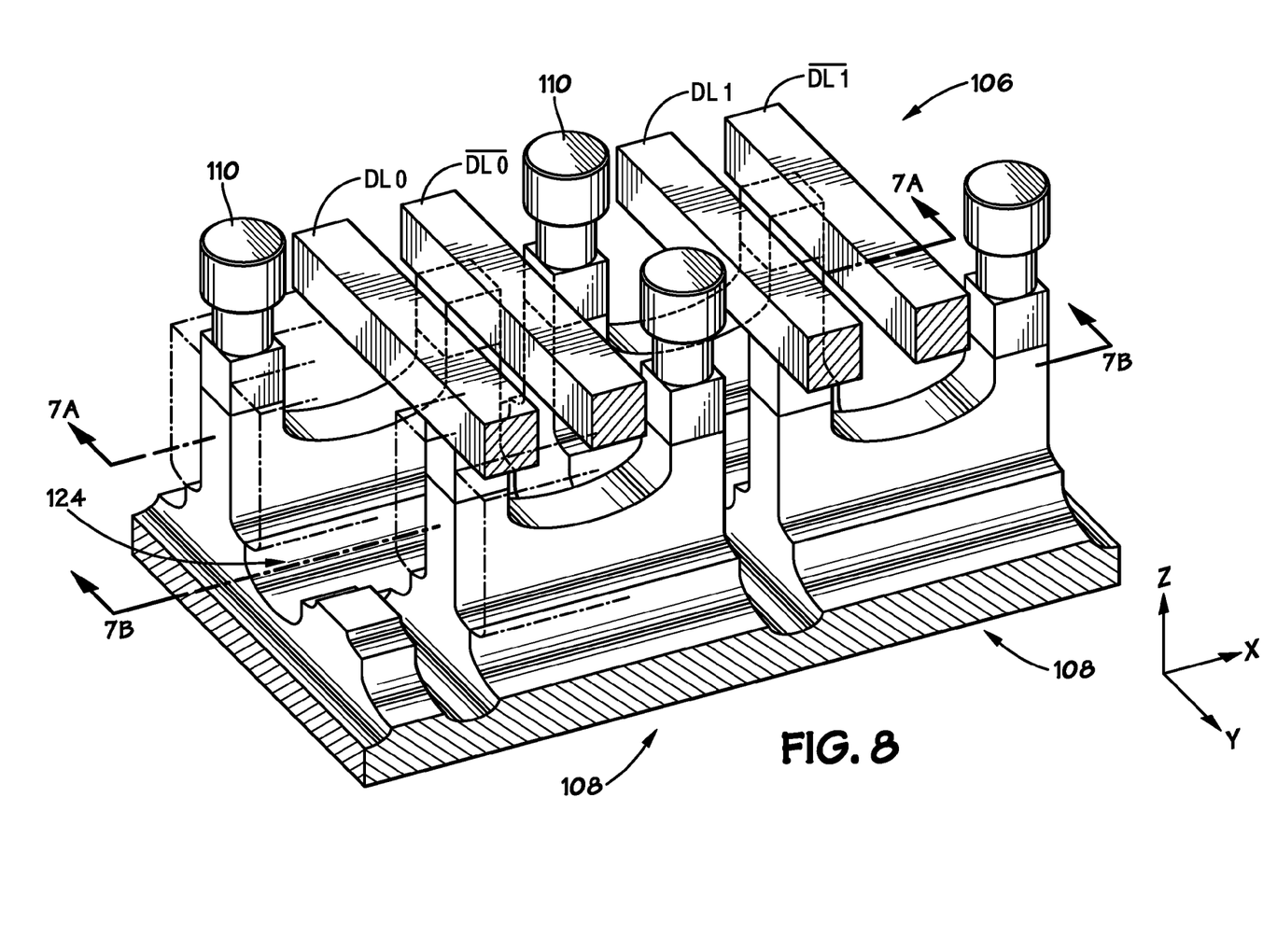
FIG. 8 illustrates a partial perspective view of the memory array of FIG. 7, in accordance with embodiments of the invention.

Generally, FIGS. 7-10 illustrate an embodiment of a partial memory array 106 having a folded digit line architecture. That is, each digit line (DL) is coupled to a memory cell at every other successive word line (WL). As will be further described, each memory cell has a cell size of approximately $6F^2$. Referring specifically to FIG. 7, a partial cross-sectional view of two word lines (WL0 and WL1) that may be fabricated in accordance with embodiments of the present invention is illustrated. As will be appreciated, the partial cross-section is taken through the cross-section of the finFETs 108, the capacitors 110 and the digit lines 112. Referring briefly to FIG. 8, a corresponding perspective view of the partial memory 106 is illustrated, wherein the cross-section corresponding to WL0 is marked by the cut-lines labeled "7A" and the cross-sectional portion corresponding to WL 1 is marked by the cut-lines "7B."

In accordance with the present embodiments, each column is "shifted" or "staggered" with respect to the two columns directly adjacent thereto. Thus, each finFET 108 of an adjacent column along a single row is shifted a distance 114 relative to the adjacent finFET 108 of the next successive column. For instance, referring again to FIG. 7, the first illustrated finFET 108 of WL1 is shifted a distance 114 relative to the first illustrated finFET 108 of WL0. The arrangement of the next successive column in the array, such as WL2 (not illustrated), would be similar to the structure of WL0. That is, the next successive column would be shifted back a distance 114, such that the first finFET 108 of WL2 would align with the first finFET 108 of WL0. Similarly, the first finFET 108 of WL3 (not illustrated), would be shifted a distance 114 with respect to the first finFET 108 of WL2, such that it aligned with the first finFET 108 of WL1. Thus, in general, each finFET 108 of a single row (e.g., the first finFET 108 in each column) will be shifted a distance 114 along the direction of the column, either right or left, with respect to each of the adjacent finFETs 108 formed on either side of the finFET 108 in the row. This pattern of shifting the structures back and forth with each successive column may be repeated throughout the entire array 106. As used herein, "shifted" or "staggered" are synonymous and refer to the relative position of finFETs in a respective row, relative to one another.

In addition, each finFET 108 along a single row is "reciprocated" or flipped with regard to the two adjacent finFETs 108 in the row (i.e., the finFETs 108 on each side of the finFET 108). That is, the transistors coupled WL0 are configured drain-to-source, in a first direction (left to right in FIG. 7), such that the current flows through the channel 116 in a second direction, opposite the first (right to left in FIG. 7, as indicated by the directional arrows of WL0), while the transistors coupled to WL1 are configured source-to-drain in the first direction, such that the current flows through the channel 116 in the opposite direction (left to right in FIG. 7, as indicated by the direction arrows of WL1), relative to that of WL0. As used herein, this flipped relationship (drain-to-source, as compared to source-to-drain) of adjacent finFETs of in a single row is referred to as "reciprocated."

In the illustrated arrangement, each digit line 112 is coupled to a finFET 108 in every other column. Thus, referring again to FIG. 7, the digit line DL0 is coupled to the source of the first illustrated finFET 108 of WL1, but is not coupled to the first finFET 108 of the word line WL0. Similarly, the digit line $\overline{DL0}$ is coupled to the source of the first illustrated finFET 108 of WL0, but is not coupled to the first finFET 108 of the word line WL1. This configuration is provided, based on the shifting of finFETs 108 in adjacent columns, as well as the increased spacing 118 between the source and drain of each finFET 108 (relative to the structure of FIG. 5). That is, the shallow trench 120 isolating the source and drain of each finFET 108 has a width 118 sufficient to allow a digit line 112 to be fabricated in a plane above but spacially between the vertical walls of the shallow trench 120, as illustrated. For instance, the width 118 may be approximately 1½F. Further, the deep isolation trench 122, separating adjacent finFETs 108 in a word line WL, may have a width approximately equal to ½F. Thus, in accordance with the present embodiment, each cell has a cell size of $6F^2$ (3F in the direction along the word line by 2F in the direction along the digit line).

Figure 9:
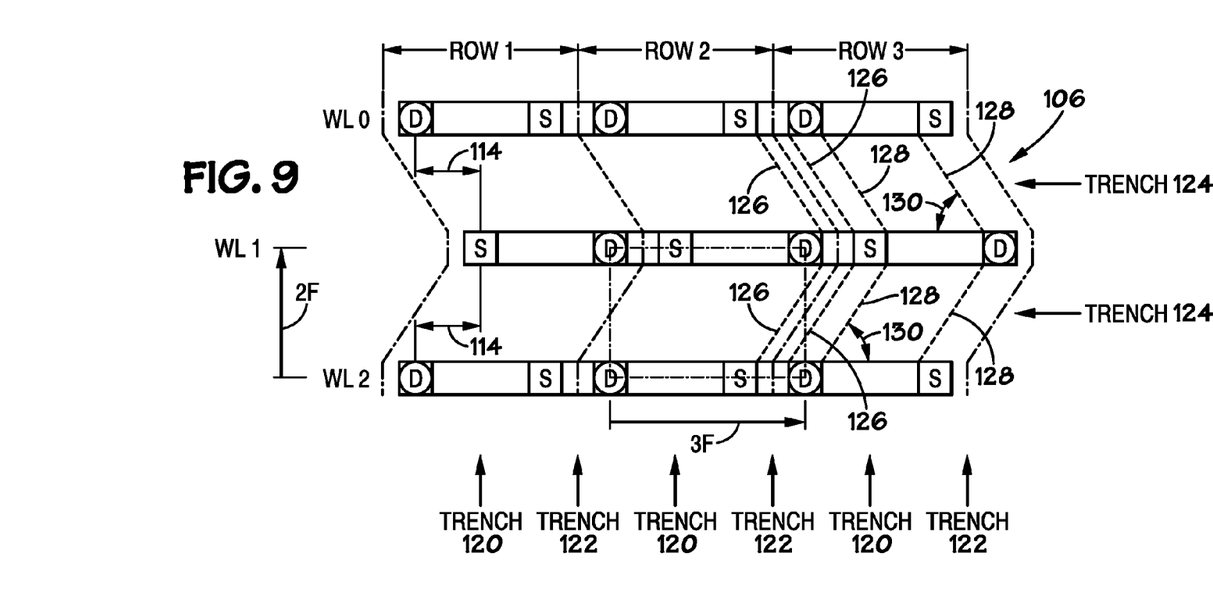
FIG. 9 illustrates a top plan view of the memory array of FIG. 7, in accordance with embodiments of the invention.
Figure 10:
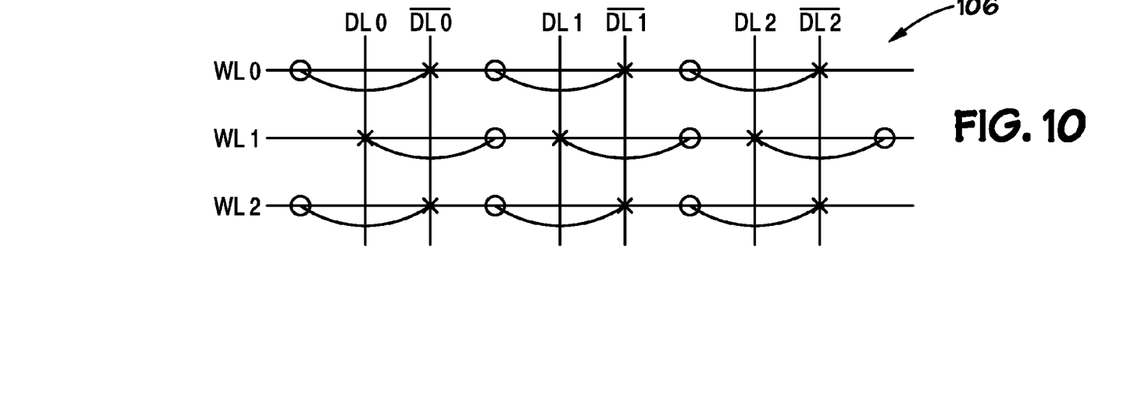
FIG. 10 illustrates a schematic view of the digit line contacts and storage node contacts of the memory array of FIG. 7, in accordance with embodiments of the invention.

Aspects of the presently described embodiment of the memory array 106 are further illustrated in FIGS. 9 and 10. FIG. 9 illustrates a top plan view of the array 106 having both a shifted and reciprocated architecture, as previously described with reference to FIGS. 7 and 8. FIG. 10 illustrates a schematic view of the same architecture, where an "O" represents a connection point of a respective digit line DL to a drain of a finFET to a respective word line WL, and an "X" represents a connection point of a respective digit line DL to the source of a finFET to a respective word line WL. As illustrated, each word line WL is shifted a distance 114, along the direction of the word line WL, relative to the next adjacent word line WL. Further, the finFETs 108 in each row are reciprocated with respect to the finFETs 108 in adjacent rows. Thus, in the illustrated embodiment, the even word lines (e.g., WL0, WL2, etc.) and the finFETs coupled to those word lines WL will have the same configuration relative to one another. Similarly, the odd word lines (e.g., WL1, WL3, etc.) and the finFETs coupled to those word lines WL will have the same configuration relative to one another. However, the odd word lines WL and the finFETs coupled thereto, will have a shifted and reciprocated arrangement relative to the even word lines WL and the finFETs coupled thereto. For instance, as illustrated in FIG. 9, the first finFET 108 of WL1 is shifted to the right a distance 114, relative to the first finFET 108 of WL0 and WL2. Further, the finFETs 108 of WL1 are reciprocated with respect to the finFETs 108 of WL0 and WL2. Thus, for each row (e.g. ROW 1, ROW 2, ROW 3, etc., marked by dashed lines) of the array 106, the successive finFETs in the row are alternatingly shifted a distance 114 along the direction of the word lines WL, left, then right, then left, etc.

As will be appreciated, the present arrangement allows for the word lines WL to be generally parallel to one another and generally linear. Similarly, each of the digit lines DL are generally parallel to each other and generally linear. The digit lines DL are constructed to be generally orthogonal with respect to the word lines WL. That is, the direction that the digit lines DL run through the array 106 is generally perpendicular to the direction that the word lines WL run through the array 106, albeit in different planes in the Z-direction. However, while the word lines and digit lines are generally linear throughout the length of the array 106, the shallow trenches 120 and isolation trenches 122, which each run the length of the digit lines through the array 106, are formed such that they weave back and forth through the array from word line to word line. That is, in accordance with the present embodiments, while the word lines WL and digit lines DL are linear throughout their respective lengths, the shallow trenches 120 and the row isolation trenches 122 are non-linear or weavy throughout their respective lengths, as they extend across the array.

As used herein, "non-linear" is synonymous with "weavy." The arrangement of the weavy row isolation trenches 122 is illustrated by the dashed lines 126. The arrangement of the weavy shallow trenches 120, formed between the legs of each finFET, is illustrated in FIG. 9 by the dashed lines 128. As will be appreciated, the trenches 120 and 122 will weave back and forth, alternating the weave direction at every word line. Thus, the illustrated weave pattern of the trenches 120 and 122 will repeat throughout the array. As will be appreciated, the weave pattern of the trenches 120 and 122 correlates with the staggered arrangement of the finFETs in each column. As used herein, a trench that changes weave direction at every word line, will be said to have a "single weave pattern." Based on the illustrated embodiment, the weave angle 130 will be approximately 63.4°, relative to the word line from which it extends. The weave angle 130 is based on the 2F pitch between each column and the 1F shift. As will be appreciated, the weave angle 130 may vary, depending on the pitch between each column and the shift of each row, relative to one another.

In other embodiments, the weave pattern may have a different pattern frequency, rather than a single weave pattern. For instance, FIGS. 11 and 12 illustrate a "double weave pattern." That is, rather than the weave angle changing at every word line, the pattern remains the weave occurs after pairs of word lines. Thus, as illustrated in FIGS. 11 and 12, the partial portion of the array 132 includes pairs of word lines having like arrangements. Thus, as illustrated, WL0 and WL1 are identical and are not shifted or reciprocated with regard to one another. The next word line pair, WL2 and WL3 (not shown), will be identical to one another, but shifted and reciprocated with regard to WL0 and WL1. As can be envisioned, the next word lines (WL4 and WL5) would be identical to the arrangement of WL0 and WL1 and would thus shift back in the opposite direction (e.g., left), with regard to WL2 and WL3. Furthermore, the trenches 120 and 122 will have a double weave pattern where the trenches weave back and forth after each pair of word lines, but run parallel to the digit lines between each word line pair, as illustrated by the dashed lines 126 and 128 of FIG. 11.

As will be appreciated, other weave pattern frequencies, may be employed as well, in accordance with embodiments of the invention. For instance, a triple weave pattern, wherein three identically arranged and fabricated columns occur, before a second set of three identically arranged and fabricated columns occur in the array, wherein the second set is shifted and reciprocated with respect to the first set. As with the embodiment described with regard to FIGS. 11 and 12, the shallow trenches between the legs of the finFETs (e.g., 120) and the deep row isolation trenches (e.g., 122) would thus be parallel to the digit lines between the trio of identically arranged and fabricated columns, and weave after every three columns. A third set of three identically arranged and fabricated columns would occur next, with the same arrangement as those of the first set, and so forth. Other groupings may also be incorporated to provide a quadruple weave pattern, etc.

As will be understood, though the various trenches are said to extend through the entire array, those skilled in the art will appreciate that once the entire memory device is completed, certain structures may be disposed or formed within portions of the trenches and the open areas of the trenches may be filled with a dielectric material to provide electrical isolation. For instance, the word lines described herein, will run through portions of each of the shallow inter-leg trenches and the deep isolation trenches, as illustrated in the figures. Further, an isolation oxide may fill the remainder of the space within the trenches. Despite the materials and structures formed or disposed in the trenches, those skilled in the art will appreciate the methods of fabricating the structures described herein and will appreciate the notion that the trenches are said to run through the entire array, as is well understood with regard to the fabrication of memory arrays.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device, comprising:
a plurality of memory cells arranged in a plurality of rows and columns, wherein the plurality of columns of the plurality of memory cells comprises a first column, a second column, and a third column of the plurality of memory cells, wherein the second column is constructed substantially between the first column and the third column, wherein each of the plurality of memory cells in a row of the first column is substantially aligned with respect to each of the plurality of memory cells in a row of the second column in a row direction, and wherein each of the plurality of memory cells in a row of the third column is shifted with respect to each of the plurality of memory cells in the row of the first column and in the row of the second column in a column direction;
a plurality of word lines, wherein each of the plurality of memory cells in a row of the plurality of rows is coupled to a respective one of the plurality of word lines;
a plurality of digit lines
and
a plurality of trenches arranged in a direction of the digit lines, wherein each of the plurality of trenches comprises a weave pattern.

2. The memory device, as set forth in claim 1, wherein each of the plurality of memory cells comprises an access transistor coupled to a capacitor.

3. The memory device, as set forth in claim 2, wherein each access transistor in the row of the third column is reciprocated with respect to at least one access transistor in the row of the first column and in the row of the second column.

4. The memory device, as set forth in claim 2, wherein each access transistor in the row of the third column is staggered with respect to at least one access transistor in the row of the first column and in the row of the second column.

5. The memory device, as set forth in claim 1, wherein the memory device comprises a folded digit line architecture.

6. The memory device, as set forth in claim 1, wherein each of the plurality of memory cells has a cell size approximately equal to $6F^2$.

7. The memory device, as set forth in claim 1, wherein each of the plurality of word lines has a width approximately equal to $\frac{1}{2}F$.

8. The memory device, as set forth in claim 1, wherein each of the plurality of digit lines has a width approximately equal to $\frac{1}{2}F$.

9. A memory device, comprising:
a first column comprising a plurality of fin field effect transistors (finFETs);
a second column comprising a plurality of finFETs, directly adjacent to the first column, wherein a first finFET of the plurality of finFETs of the second column is not reciprocated and aligned in a row direction with respect to a first finFET of the plurality of finFETs of the first column; a third column comprising a plurality of finFETs, directly adjacent to the second column, wherein the second column locates in between the first column and the third column, wherein a first finFET of the plurality of finFETs of the third column is reciprocated with respect to the first finFET of the plurality of finFETs of the second column, and wherein the first finFET of the plurality of finFETs of the third column is shifted a distance in a column direction, with respect to the respective first finFETs of the plurality of finFETs of the first column and the second column; and
a plurality of column isolation trenches formed respectively between the first column and the second column and between the second column and the third column.

10. The memory device, as set forth in claim 9, wherein the distance is approximately equal to F.

11. The memory device, as set forth in claim 9, wherein each of the plurality of memory cells has a cell size approximately equal to 6F2.

* * * * *

UNITED STATES PATENT AND TRADEMARK OFFICE
CERTIFICATE OF CORRECTION

PATENT NO. : 8,872,247 B2  Page 1 of 1
APPLICATION NO. : 12/612546
DATED : October 28, 2014
INVENTOR(S) : Shigeki Tomishima It is certified that error appears in the above-identified patent and that said Letters Patent is hereby corrected as shown below:

In The Claims

In column 12, line 41, in Claim 11, delete "6F2." and insert -- $6F^2$. --, therefor.

Signed and Sealed this
Thirtieth Day of December, 2014

Michelle K. Lee
*Deputy Director of the United States Patent and Trademark Office*